(12) United States Patent
Lee et al.

(10) Patent No.: US 6,468,498 B1
(45) Date of Patent: Oct. 22, 2002

(54) COMPOSITE METAL MATERIAL, PREPARATION THEREOF AND PHOTOCATALYTIC PROCESS USING SAME

(75) Inventors: Sang-Goo Lee, Kyungki-do (KR); Min-Chan Kim, Cheju-si (KR); Gil-Seon Kang, Bukcheju-gun (KR); Wha-Young Lee, Seoul (KR); In-Kyu Song, Kangwon-do (KR); Young-Gwan Ko, Seoul (KR)

(73) Assignee: Idbule Photonics Co., Ltd. (KR)

( * ) Notice: Subject to any disclaimer, the term of this patent is extended or adjusted under 35 U.S.C. 154(b) by 0 days.

(21) Appl. No.: 09/823,576

(22) Filed: May 25, 2001

(30) Foreign Application Priority Data

Apr. 3, 2000 (KR) .......................... 2000-17243
Nov. 21, 2000 (KR) .......................... 2000-69268

(51) Int. Cl.[7] .................. C01G 21/02; C01G 9/02; C01G 49/02; C07C 1/00; C01B 13/00
(52) U.S. Cl. .................. 423/619; 423/608; 423/622; 423/632; 423/633; 423/635; 204/157.15; 204/157.5; 204/157.52
(58) Field of Search ................. 423/593, 594, 423/598, 608, 619, 622, 632, 633, 635; 204/157.15, 157.5, 157.52

(56) References Cited

U.S. PATENT DOCUMENTS 4,858,066 A * 8/1989 McSweeney ............. 361/321

\* cited by examiner

*Primary Examiner*—Edna Wong
(74) *Attorney, Agent, or Firm*—Anderson Kill & Olick, PC

(57) ABSTRACT

A composite metal material of formula (I) are stable and not deteriorated for a long time and have excellent activities in photolyzing water with visible light:

$$x(A)y(B)z(C)\text{-}p(P)n(N) \quad (I)$$

wherein, (A) is $Pb(Mg_{1/3}Nb_{2/3})O_3$ or $Pb(Zn_{1/3}Nb_{2/3})O_3$, (B) is $PbTiO_3$, (C) is $LiTaO_3$, (P) is a metal selected from the group consisting of Pt, Au, Ag, Pd and Rh, (N) is an oxide of a metal selected from the group consisting of Ni, Co, Fe, Sr, Sc, Ru, Cu and Cd, x is a number in the range of 0.65 to 0.98, y is a number in the range of 0.01 to 0.34, z is a number in the range of 0.01 to 0.1, and p and n are each independently a number in the range of 0.01 to 5.

2 Claims, 3 Drawing Sheets

COMPOSITE METAL MATERIAL, PREPARATION THEREOF AND PHOTOCATALYTIC PROCESS USING SAME

FIELD OF THE INVENTION

The present invention relates to a novel composite metal material, a preparation process thereof, and a photocatalytic process using same, particularly photolysis of water effectuated with visible light to produce hydrogen and oxygen.

BACKGROUND OF THE INVENTION

Many studies have been made on photon energy conversion systems to utilize solar energy effectively. In particular, there has been a great interest in producing hydrogen and oxygen from water by bringing water into contact with light in the presence of a photocatalyst. Such a process has the advantages that the resource is unlimited and clean and high-power energy can be provided without generating environmental problems.

Since A. Fujishima and K. Honda reported the use of a $TiO_2$ electrode as a photocatalyst in *Nature*, Vol. 37, 238 (1972), many photocatalysts have been developed. For example, U.S. Pat. No. 5,262,023 discloses homogeneous semiconductor photocatalysts such as $TiO_2$ and $SrTiO_3$. Further, *Catalysis Today*, Vol. 44, pp 17–26 (1998) discloses the use of heterogeneous photocatalysts such as $BaTi_4O_9$, $K_2Ti_6O_{13}$, $Na_2Ti_6O_{13}$ and $K_4Nb_6O_{17}$, in combination with a minor amount of an oxide of a transition, rare earth or novel metal, such as $NiO_x$, $RuO_x$, $RhO_x$ or Pt.

However, the photocatalysts disclosed in the prior art references exhibit marginal photoylsis activity only at the wavelength range of ultraviolet light.

As an attempt to avoid the use of UV light, S. Ikeda et al. suggested the use of $CuFeO_2$ as a photocatalyst for photolysis of water at the wavelength range of near visible light in *Stud. Surf Sci. Catal.* 121, Proc. TOCAT 3, 301–304 (1999). However, this material has such a low activity that hydrogen can be produced at a rate of only about 1 $\mu$mol/hr of catalyst.

Although other materials have also been reported to function as photocatalysts in photolysis of water with near visible light (e.g., see J. Yoshimura et al., *Bull. Chem. Soc. Hpn.*, Vol. 68, 2439–2445 (1995)), they still have low activities.

SUMMARY OF THE INVENTION

It is, therefore, a primary object of the invention to provide new photocatalytic materials which are stable under photolysis conditions and have excellent activities as well as good activity maintenance characteristics in photolyzing water with visible light.

In accordance with an aspect of the present invention, there is provided a composite metal compound of formula (I)

$$x(A)y(B)z(C)\text{-}p(P)n(N) \qquad (I)$$

wherein, (A) is $Pb(Mg_{1/3}Nb_{2/3})O_3$ or $Pb(Zn_{1/3}Nb_{2/3})O_3$, (B) is $PbTiO_3$, (C) is $LiTaO_3$, (P) is a metal selected from the group consisting of Pt, Au, Ag, Pd and Rh, (N) is an oxide of a metal selected from the group consisting of Ni, Co, Fe, Sr, Sc, Ru, Cu and Cd, x is a number in the range of 0.65 to 0.98, y is a number in the range of 0.01 to 0.34, z is a number in the range of 0.01 to 0.1, and p and n are each independently a number in the range of 0.01 to 5.

In accordance with another aspect the present invention, there is provided a process for preparing the composite metal compound of formula (I) in the form of particles, which comprise the steps of:

(a) mixing a component selected from $Pb(Mg_{1/3}Nb_{2/3})O_3$ and $Pb(Zn_{1/3}Nb_{2/3})O_3$ with $PbTiO_3$, and $LiTaO_3$, in relative molar amounts ranging from 0.65 to 0.98, 0.01 to 0.34 and 0.01 to 0.1, respectively, (b) adding, to the mixture obtained in (a), a metal selected from the group consisting of Pt, Au, Ag, Pd and Rh, and an oxide of a metal selected from the group consisting of Ni, Co, Fe, Sr, Sc, Ru, Cu and Cd, in amounts ranging from 0.01 to 5% by weight based on the mixture, and (c) calcining the mixture obtained in (b), followed by pulverizing the calcination product.

In accordance with a further aspect of the present invention, there is provided a single crystal of formula (I).

In accordance with a further aspect of the present invention, there is provided a process for preparing a single crystal of formula (I), which further comprises the step of (d) melting down the compound of formula (I) obtained in the above step (c) and cooling the molten product to crystallize.

In accordance with a still further aspect of the present invention, there is provided a photocatalytic process for producing hydrogen and oxygen from water using the inventive composite metal material in the form of particles of the compound or the single crystal of formula (I) at the wavelength range of visible light.

BRIEF DESCRIPTION OF THE DRAWINGS

The above and other objects and features of the present invention will become apparent from the following description thereof, when taken in conjunction with the accompanying drawings wherein.

DETAILED DESCRIPTION OF THE INVENTION

Figure 1:
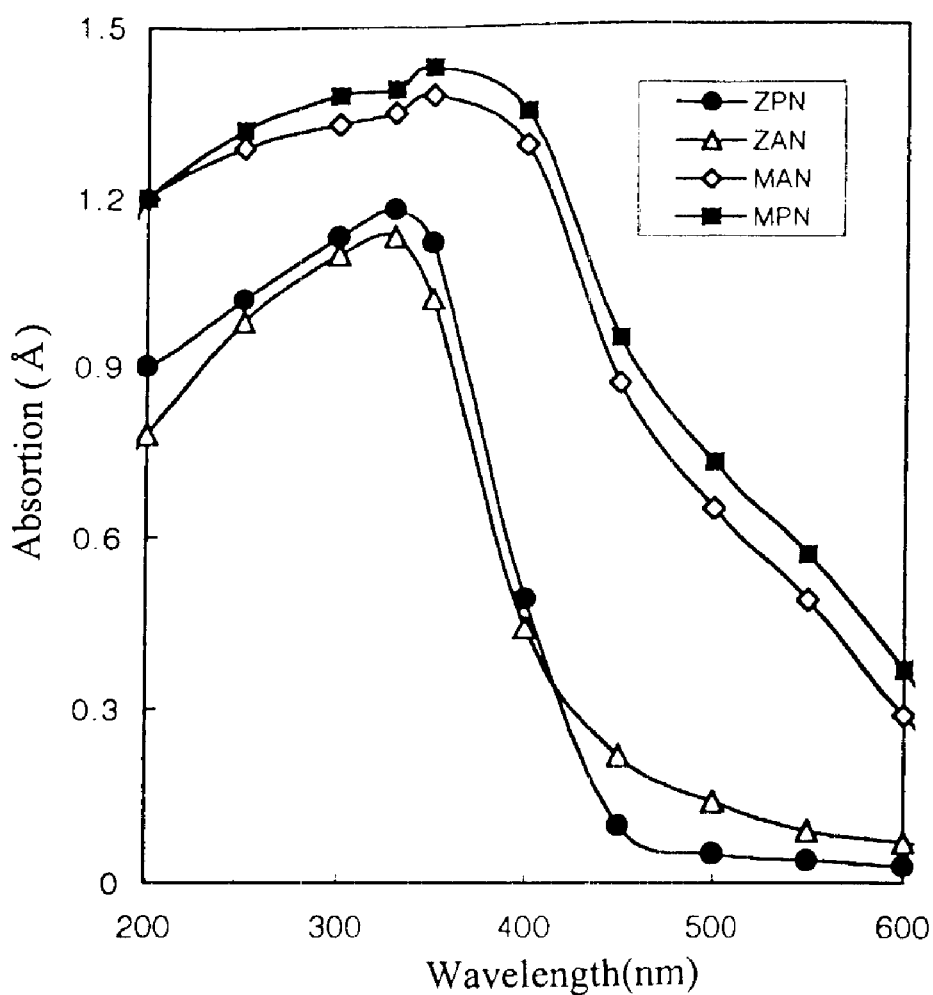
FIG. 1 shows UV/VIS absorption spectra of the inventive composite metal materials.

The composite metal material of formula (I) of the present invention is a novel, homogeneous material, which can be prepared by a solid phase reaction and optionally melting-crystallized.

Specifically, in the present invention, $Pb(Mg_{1/3}Nb_{2/3})O_3$ or $Pb(Zn_{1/3}Nb_{2/3})O_3$ is mixed with $PbTiO_3$ and $LiTaO_3$ in relative molar amounts ranging from 0.65 to 0.98, 0.01 to 0.34 and 0.01 to 0.1, respectively. Thereafter, to the resulting mixture, a metal selected from the group consisting of Pt, Au, Ag, Pd and Rh, and an oxide of a metal selected from the group consisting of Ni, Co, Fe, Sr, Sc, Ru, Cu and Cd are added in amounts ranging from 0.01 to 5% by weight based on the resulting mixture.

Subsequently, the resulting mixture was triturated in an organic solvent such as ethanol and isopropanol, dried at a temperature of 150 to 200° C., and calcined at a temperature of 850 to 1,000° C. for 1 to 10 hours.

The composite metal material thus obtained in the form of a ceramic powder may be directly used as a photocatalyst, or alternatively, further homogenized by a post melting-crystallization process.

In the melting-crystallization process, the ceramic powder is allowed to melt at a high temperature of 1,300 to 1,500° C. under a pressure of 20 to 200 psi, and the melt is slowly cooled to room temperature over a period of 80 to 120 hours, rendering it to crystallize. The composite metal material obtained in this step is a single crystal having a homogeneous composition and its physicochemical characteristics are different from those of the ceramic powder obtained in the above solid phase reaction.

The single crystal of formula (I) may be preferably pulverized for use as a photocatalyst.

The inventive materials may be preferably used in the form of particles having a particle size of 0.1 to 50 $\mu$m and a specific surface ranging from 1 to 100 m$^2$/g, more preferably from 50 to 60 m$^2$/g.

The inventive composite metal material exhibits a broad and strong absorption even at the visible light wavelength range and thus can be beneficially used as a photocatalyst, e.g., in the photolysis of water into hydrogen and oxygen. The inventive metal materials has such a high photocatalytic activity that hydrogen can be produced at a rate of 10 to 100 $\mu$mol/hr/g of catalyst.

Further, the inventive materials have good stability, and they also not undergo deactivation over an extended period of time. After use, they can be regenerated by a conventional manner.

The following Examples are given for the purpose of illustration only and are not intended to limit the scope of the invention.

EXAMPLE

Preparation of Composite Metal Materials

Raw materials as listed in Table 1 were metered and mixed, and the resulting mixture was triturated in an ethanol medium using a 0.5" zirconia ball mill. Subsequently, the resulting mixture was dried at about 150° C. in a controlled electric furnace, and calcined at about 920° C. for 6 hours in a capped alumina crucible.

The material thus obtained was pulverized with a ball mill. The powder was charged in a Pt crucible, and the crucible was covered and placed in a high temperature crystal growth furnace (1500° C., 100 psi) for 20 hours to melt the powder completely. The melt was cooled slowly to 20° C. over 120 hours to obtain a semi-transparent, homogeneous single crystal.

TABLE 1

| Raw materials | x(A) | Y(B) | z(C) | p(P) | n(N) | Composition Formula |
|---|---|---|---|---|---|---|
| Material 1 | Pb(Mg$_{1/3}$Nb$_{2/3}$)O$_3$ 0.8 mol | PbTiO$_3$ 0.18 mol | LiTaO$_3$ 0.02 mol | Pt 1 wt % | NiO 1 wt % | MPN |
| Material 2 | Pb(Mg$_{1/3}$Nb$_{2/3}$)O$_3$ 0.8 mol | PbTiO$_3$ 0.18 mol | LiTaO$_3$ 0.02 mol | Ag 1 wt % | NiO 1 wt % | MAN |
| Material 3 | Pb(Zn$_{1/3}$Nb$_{2/3}$)O$_3$ 0.89 mol | PbTiO$_3$ 0.09 mol | LiTaO$_3$ 0.02 mol | Pt 1 wt % | NiO 1 wt % | ZPN |
| Material 4 | Pb(Zn$_{1/3}$Nb$_{2/3}$)O$_3$ 0.89 mol | PbTiO$_3$ 0.09 mol | LiTaO$_3$ 0.02 mol | Ag 1 wt % | NiO 1 wt % | ZAN |

Footnote:
MPN: 0.8[Pb(Mg$_{1/3}$Nb$_{2/3}$)O$_3$]0.18[PbTiO$_3$]0.02[LiTaO$_3$]-1[Pt]1[NiO]
MAN: 0.8[Pb(Mg$_{1/3}$Nb$_{2/3}$)O$_3$]0.18[PbTiO$_3$]0.02[LiTaO$_3$]-1[Ag]1[NiO]
ZPN: 0.8[Pb(Zn$_{1/3}$Nb$_{2/3}$)O$_3$]0.18[PbTiO$_3$]0.02[LiTaO$_3$]-1[Pt]1[NiO]
ZAN: 0.8[Pb(Zn$_{1/3}$Nb$_{2/3}$)O$_3$]0.18[PbTiO$_3$]0.02[LiTaO$_3$]-1[Ag]1[NiO]

The UV/VIS absorption spectra of the four materials obtained above were measured using RSA-TE-19M of Perkin-Elmer Co. The results in FIG. 1 illustrate that the inventive composite metal materials have broad absorption peaks at the visible light wavelength range ranging from 420 to 600 nm.

This results implies that the inventive composite metal materials can be effectively activated by visible light.

Photocatalytic Performance Test

The photocatalytic performance characteristics of the composite metal materials prepared in Example were evaluated as follows.

Each material was pulverized to a particle size of about 0.1 $\mu$m and a specific surface of about 60 m$^2$/g, and 1 g of the resulting particles was dispersed into 400 ml of distilled water. The dispersion was charged to an inner irradiation immersion cell in a clear, quartz vessel and irradiated with a high pressure mercury lamp to carry out the photolysis reaction of water to produce hydrogen and oxygen.

The hydrogen and oxygen generated were separately entrapped using a conventional manner, and the amount of hydrogen entrapped was quantified with a gas chromatography (HP-4500 of Hewlett-Packard). The results are shown in FIG. 2.

Further, in order to confirm that the inventive materials have high photocatalytic activity at the visible range, the above procedure was repeated with light that was filtered with a filter to ensure the exclusion of light having wavelength shorter than 420 nm. The results are shown in FIG. 3.

Figure 2:
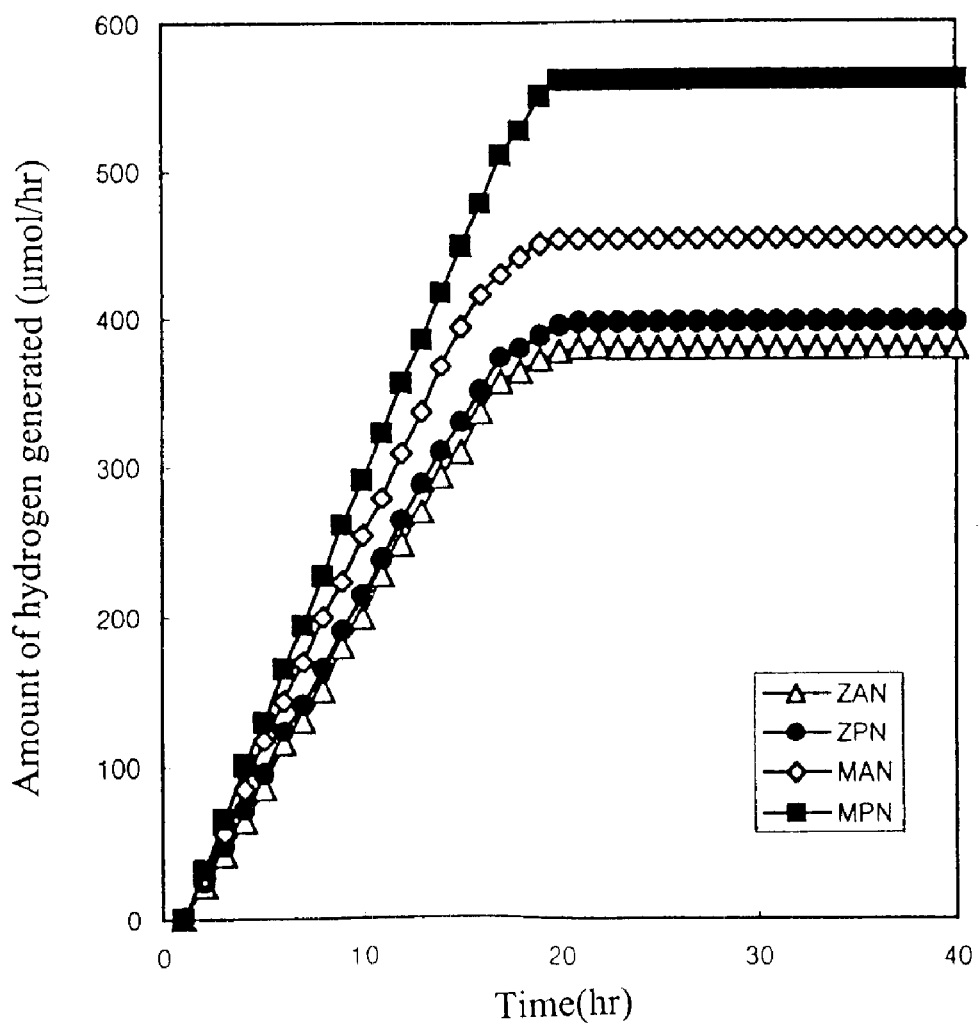
FIGS. 2 and 3 show the rate of hydrogen generated observed when the particles of the inventive composite metal materials are employed as photocatalysts in the photolysis of water conducted with a mercury lamp and visible light, respectively.
Figure 3:
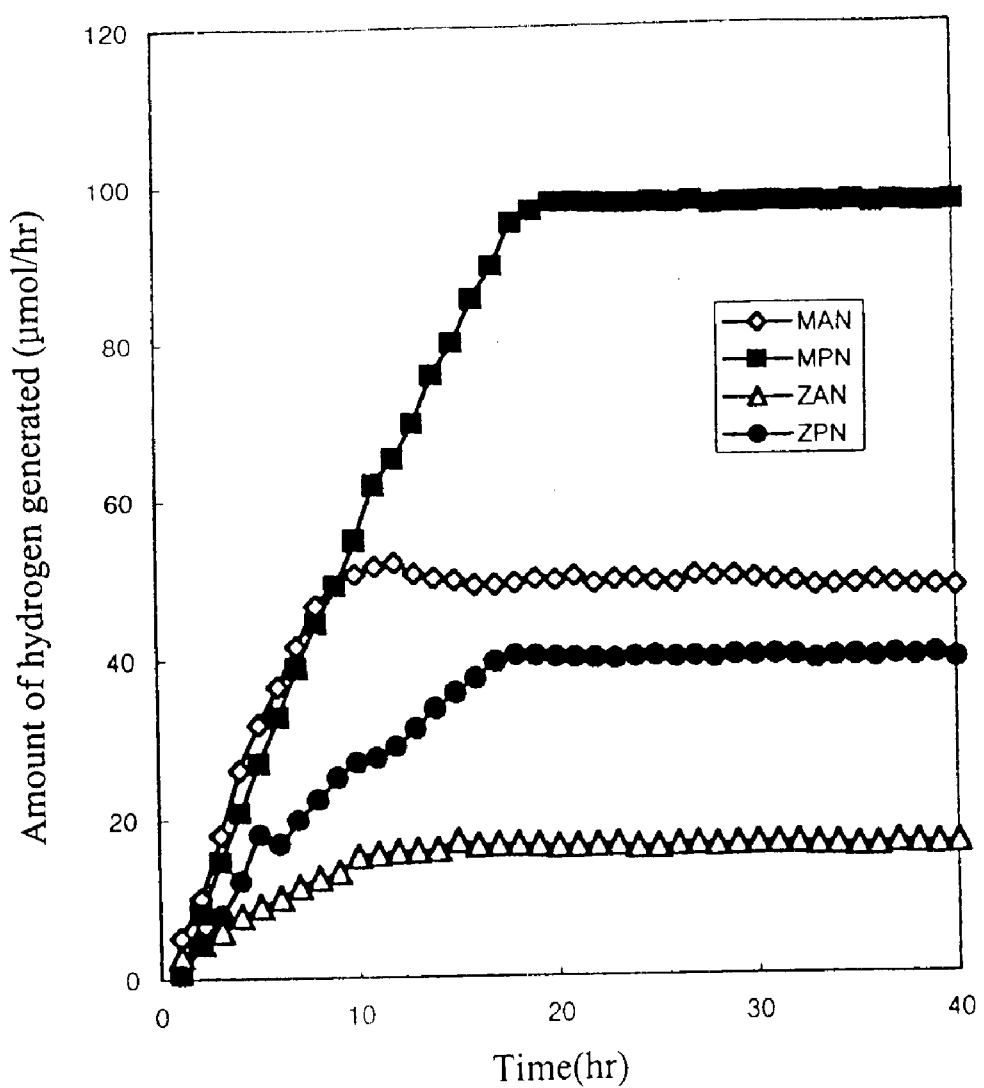

From FIGS. 2 and 3, it can be seen that the inventive composite metal materials can indeed be effectively activated by visible light and, therefore, they can be beneficially used in various photocatalytic reactions, e.g., in the photolysis of water to produce hydrogen and oxygen, using sunlight.

While the invention has been described in connection with the above specific embodiments, it should be recognized that various modifications and changes may be made to the invention by those skilled in the art without departing from the scope of the invention as defined by the appended claims.

What is claimed is:

1. A composite metal material of formula (I):

$$x(A)y(B)z(C)\text{-}p(P)n(N) \quad (I)$$

wherein,
(A) is Pb(Mg$_{1/3}$Nb$_{2/3}$)O$_3$ or Pb(Zn$_{1/3}$Nb$_{2/3}$)O$_3$,
(B) is PbTiO$_3$,
(C) is LiTaO$_3$,
(P) is a metal selected from the group consisting of Pt, Au, Ag, Pd and Rh, (N) is an oxide of a metal selected from the group consisting of Ni, Co, Fe, Sr, Sc, Ru, Cu and Cd, x is a number in the range of 0.65 to 0.98, y is a number in the range of 0.01 to 0.34, z is a number in the range of 0.01 to 0.1, and p and n are each independently a number in the range of 0.01 to 5.

2. A photocatalytic process for producing hydrogen and oxygen from water, which comprises bringing water into contact with the composite metal material of formula (I) according to claim 1, while irradiating the material with visible light.

* * * * *

UNITED STATES PATENT AND TRADEMARK OFFICE
CERTIFICATE OF CORRECTION

PATENT NO.    : 6,468,498 B1
DATED         : October 22, 2002
INVENTOR(S)   : Sang-Goo Lee et al.

It is certified that error appears in the above-identified patent and that said Letters Patent is hereby corrected as shown below:

<u>Title page,</u>
Item [73], should read as follows:
-- Ibule Photonics Co., Ltd. (KR) --

Signed and Sealed this

Twenty-fifth Day of February, 2003

JAMES E. ROGAN
*Director of the United States Patent and Trademark Office*